(12) United States Patent
Ryding et al.

(10) Patent No.: US 6,501,078 B1
(45) Date of Patent: Dec. 31, 2002

(54) ION EXTRACTION ASSEMBLY

(75) Inventors: Geoffrey Ryding, Manchester, MA (US); Theodore H. Smick, Essex, MA (US); Marvin Farley, Ipswich, MA (US); Takao Sakase, Rowley, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/527,031

(22) Filed: Mar. 16, 2000

(51) Int. Cl.[7] ............. H01J 37/15; H01J 37/08; H01J 27/02
(52) U.S. Cl. ............. 250/423 R; 250/396 R; 250/492.21; 315/111.81
(58) Field of Search ............. 250/423 R, 492.21, 250/396 R, 492.1, 281, 306; 315/111.81

(56) References Cited

U.S. PATENT DOCUMENTS

| | | | |
|---|---|---|---|
| 4,191,385 A | 3/1980 | Fox et al. | |
| 4,207,489 A | 6/1980 | Camplan et al. | |
| 5,920,076 A | * 7/1999 | Burgin et al. | 250/492.21 |
| 6,207,964 B1 | * 3/2001 | McIntyre et al. | 250/492.21 |

FOREIGN PATENT DOCUMENTS

| | | |
|---|---|---|
| GB | 2336029 | 10/1999 |
| JP | 2000-182526 | 6/2000 |
| WO | WO 9704474 | 2/1997 |

* cited by examiner

Primary Examiner—John R. Lee
Assistant Examiner—David A. Vanore
(74) Attorney, Agent, or Firm—Boult Wade Tennant

(57) ABSTRACT

An ion electrode extraction assembly comprising an ion source 20 and at least one electrode 50 having a gap through which a beam of extracted ions passes in use. An electrode manipulator assembly 55 is provided to move the electrode so as to vary the width of the gap transversely to the ion beam, move the electrode transversely to the ion beam, and move the electrode in the direction of the ion beam. The three degrees of movement being carried out independently of one another.

18 Claims, 8 Drawing Sheets

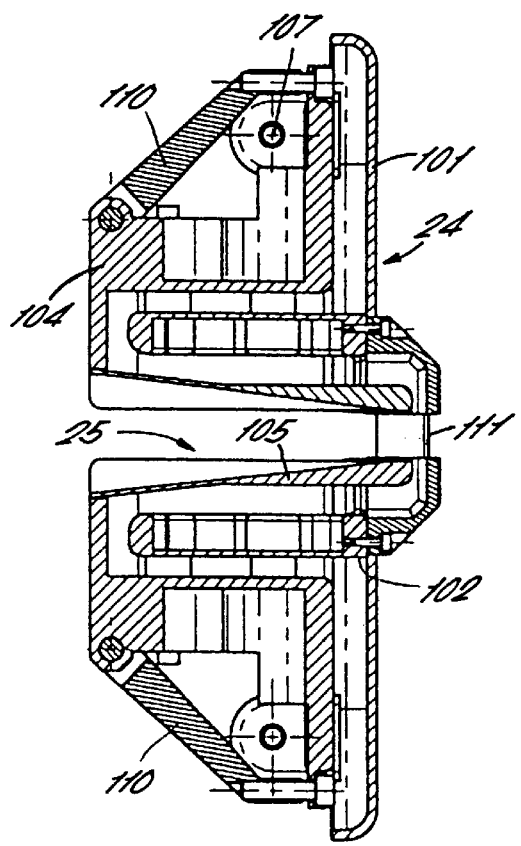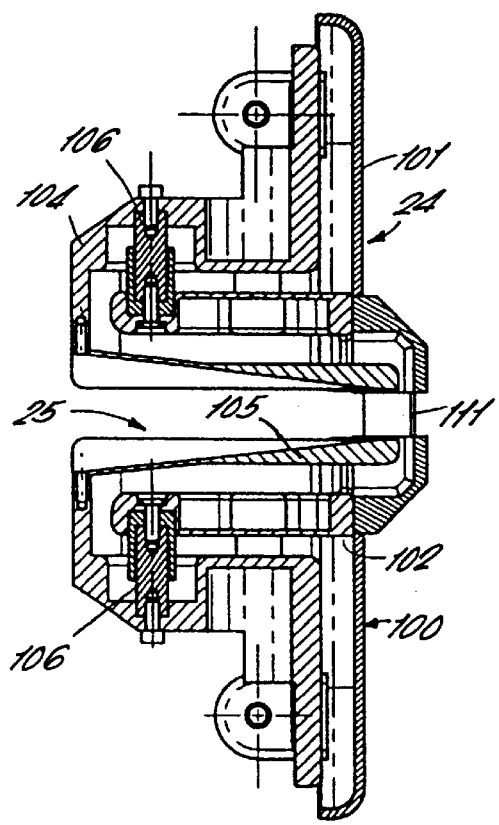

ION EXTRACTION ASSEMBLY

FIELD OF THE INVENTION

This invention relates an ion extraction assembly for generating a beam of ions. In particular, the invention relates to an improved electrode manipulator for such an assembly.

DESCRIPTION OF THE PRIOR ART

Extraction assemblies are known in the art having several electrodes positioned adjacent to an ion source to extract a beam of ions from the source. Each electrode has a slit through which the beam of ions passes.

WO 97/04474 discloses an ion beam apparatus in which a pair of extraction electrodes are mounted so as to be movable in a first direction towards or away from the ion source (i.e. the direction of the ion beam), and independently movable in a transverse direction (i.e. across the ion beam).

Each of the extraction electrodes is provided with a pair of apertures which can be selectively brought into line with the ion beam upon transverse movement of the electrodes. The apertures have different sizes each defining the extraction optics for a particular range of extraction conditions. While this is an improvement on a conventional electrode assembly, it is still limited to two discrete sets of extraction conditions.

The present invention provides an improvement of this assembly.

SUMMARY OF THE INVENTION

According to the present invention, there is provided an ion extraction assembly comprising an ion source, at least one electrode for extracting ions from the source, the electrode having a slit through which a beam of extracted ions passes in use, and an electrode manipulator on which the electrode is mounted, the manipulator having first and second actuators for selectively varying the width of the electrode slit transversely to the ion beam and moving the electrode transversely to the ion beam, and a third actuator to move the electrode in the direction of the ion beam.

By offering control of the width of the slit as well as the position of the electrode, the invention provides a manipulator which allows the electrodes to be used across a wide dynamic range. Across this wide range, the adjustments can be made continuously allowing fine adjustment of the extraction conditions. This is extremely useful in practice where it is becoming increasingly important to be able to switch quickly between a variety of extraction conditions.

The actuators may be arranged such that the first actuator is operative to move the electrode as a whole transversely to the ion beam, and so that the second actuator is operative to move one part of the electrode with respect to the other part which is fixed to control the slit width. Alternatively, the two parts of the electrode may each be movable under the control of a respective first and second actuator in the transverse direction to control both the transverse position and the slit width. However, neither of these alternatives allows independent control of the slit width and transverse position of the electrode, as the movement caused by one actuator to change either the slit width or the transverse position will require a compensatory movement of the other actuator to maintain the desired slit width and transverse position.

Therefore, preferably the first actuator is operative to vary the width of the electrode slit, and the second actuator is operative to move the electrode transversely to the ion beam, the first, second and third actuator arranged to operate independently of one another. This provides independent control of the slit width and transverse position.

As the electrode comprises two parts which are movable relatively to one another, precise alignment of the two parts of the electrode in the direction of the ion beam may be difficult to achieve on assembly. Therefore, preferably the electrode comprises two parts which between them form the slit, wherein part of the electrode is movable relatively to the other part of the electrode in the direction of the ion beam. This allows any misalignment of the parts of the electrode in the beam direction to be corrected. This may be achieved by using the third actuator to move both electrode parts together in the direction of the ion beam and providing a fourth actuator to move one part of the electrode relatively to the other in this direction. Alternatively, the third actuator could move one part of the electrode in the direction of the ion beam and a fourth actuator could move the other part in this direction.

Preferably, the first actuator is mounted on and moveable with one of the second and third actuators, the one of the second and third actuators being mounted on and movable with the other of the second and third actuators. By mounting the first actuator to one of the other actuators, the slit width control can be carried out using a simple actuator while remaining independent of the operation of the actuator on which it is mounted.

The electrode is preferably movably mounted by at least one air bearing. Preferably, the air bearing is a porous plate type air bearing provided with differentially pumped seal. Such bearings have been found to be particularly advantageous in this application as they offer high stiffness and precision, low friction and high speed servo capabilities. This type of air bearing is preferably used at least for the actuator for varying the width of the electrode slit transversely to the ion beam, and for moving the electrode transversely to the ion beam. In order to shield the air bearing from contaminants, when the electrode is supported on at least one shaft, the or each shaft is preferably surrounded by a shield plate movable with the shaft to shield the air bearing in all positions of the electrode.

The first actuator preferably comprises a first motor for driving a first lead screw having a first portion with a screw thread, and a second portion with a screw thread of oppositely handed configuration to the first screw thread, the electrode being provided in two halves, one of which is threadably coupled to the first screw threaded portion, and the other of which is threadably coupled to the second screw threaded portion, so as to be movable in opposite directions upon rotation of the first lead screw.

The first actuator is preferably slidably mounted on a plate, and the second actuator is preferably fixed to the plate and comprises a second motor and a second lead screw threadably coupled to the first actuator in order to move the entire first actuator and electrode transversely to the ion beam upon rotation of the second lead screw.

A pair of air bearing side guides are preferably provided to depend from the plate in order to restrain the electrode to move only in the direction transverse to the ion beam.

The third actuator is preferably fixed to a housing and comprises a third motor driving a third lead screw, threadably coupled to a top plate, the top plate being slidably retained on the housing so as to be movable in the direction of the ion beam, upon rotation of the third lead screw.

The invention also extends to a method of adjusting an electrode in an ion extraction assembly comprising at least one electrode for extracting ions from an ion source, the electrode having a gap through which a beam of extracted ions passes, in use, and an electrode manipulator on which the electrode is mounted, the method comprising the steps of varying the width of the electrode slit transversely to the ion beam, adjusting the electrode transversely to the ion beam, and adjusting the electrode in the direction of the ion beam, all three movements being carried out independently.

The method preferably further comprises, providing at least one porous plate air bearing with a differentially pumped seal to support the electrode, supplying air to the air bearing, and pumping the differentially pumped seal.

The electrode manipulator can be used for any type of electrode where the three degrees of motion provided by the present invention are required. One particular preferred application for the present invention is to a triode assembly comprising a source electrode, and a pair of electrodes being movable together by the electrode manipulator. The invention is equally applicable to a tetrode assembly.

BRIEF DESCRIPTION OF THE DRAWINGS

An example of an ion extraction assembly constructed in accordance with the present invention will now be described with reference to the accompanying drawings, in which:

FIG. 8A is a section through line 8A—8A in FIG. 6; and

FIG. 8B is a section through line 8B—8B in FIG. 6.

DESCRIPTION OF PREFERRED EMBODIMENT

Figure 1:
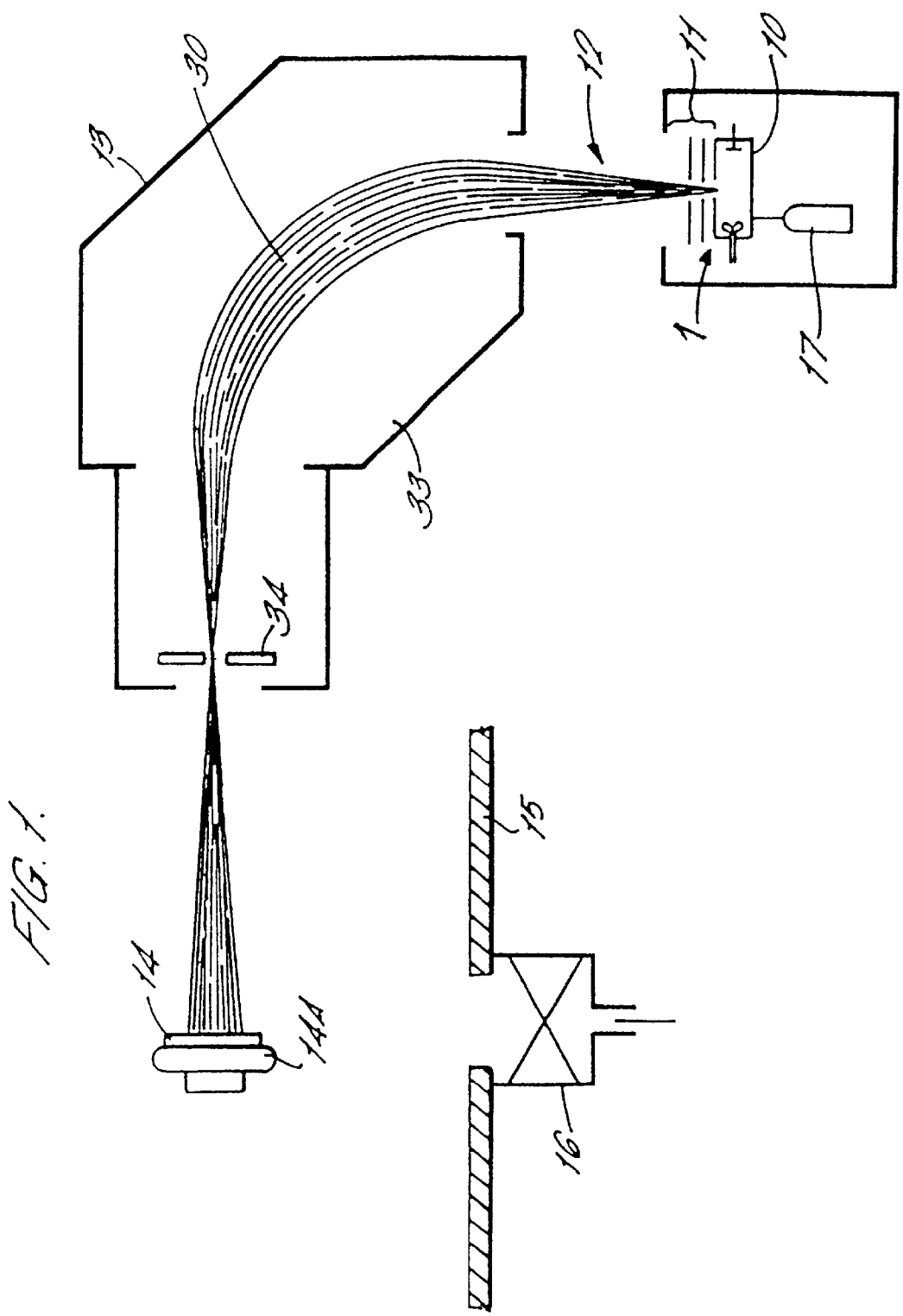
FIG. 1 is a schematic plan view of an ion implanter with which an ion extraction assembly according to the present invention may be used.

Referring to FIG. 1, an ion implanter apparatus comprises an extraction assembly 1 comprising an ion beam source 10 with a set of extraction electrodes 11, directing an ion beam 12 through an ion mass selector 13 to impinge on a target substrate 14 mounted on a target substrate holder 14A. As is well known to workers in this field, the above elements of the ion implanter are housed in a vacuum housing of which a part 15 only is illustrated in FIG. 1. The vacuum housing may be evacuated by a vacuum pump 16.

The ion source 10 may comprise any known ion source such as a Freeman source or a Bernas source. The ion source 10 comprises an arc chamber to which is fed a supply of atoms of or molecules containing the element, ions of which are to be implanted in the target substrate 14. The molecules may be supplied to the arc chamber in gaseous or vapour form, e.g. from a gas bottle 17.

The set of extraction electrodes 11 is located immediately outside a front face of the arc chamber of the ion source 10 so as to extract ions from the arc chamber through an exit aperture in the front face.

The ion mass selector 13 illustrated in FIG. 1 comprises a magnetic sector mass analyser 33 operating in conjunction with a mass selecting slit 34. The magnetic analyser 33 comprises a region of magnetic field in the direction perpendicular to the plane of the paper in FIG. 1. In such a magnetic field, all ions of constant energy and having the same mass-to-charge ratio will describe circular paths. The radius of curvature of the path is dependent on the mass-to-charge ratio of the ions, assuming uniform energy.

As is well known for such magnetic sector analysers, the geometry of such paths tends to bring a cone of ion paths emanating from an origin focus outside the entrance aperture of the analyser 33, back to a focus beyond the exit aperture of the analysers. As illustrated in FIG. 1, the origin focus or point of origin of the central beam 30 is a point close to, typically just inside, the exit aperture of the arc chamber of the ion source 10. The beam 30 is brought to a focus in the plane of the mass selection slit 34 beyond the exit aperture of the analyser.

In FIG. 1, the beam 30 is drawn showing only ions of a single mass/charge ratio, so that the beam comes to a single focus at the aperture of the slit 34, so that the beam of ions of this mass/charge ratio can pass through the slit 34 towards the target substrate 14. In practice, the beam emitted by the ion source 10 will also contain ions of different mass/charge ratio from those desired for implantation in the substrate 14. These undesired ions will have a different radius of curvature from the desired ions and will not pass through the slit. The desired ions will be brought to a focus by the analyser 33 at a point in the plane of the slit 34. The analyser 33 thus has a dispersion plane in the plane of the drawing.

Figure 2:
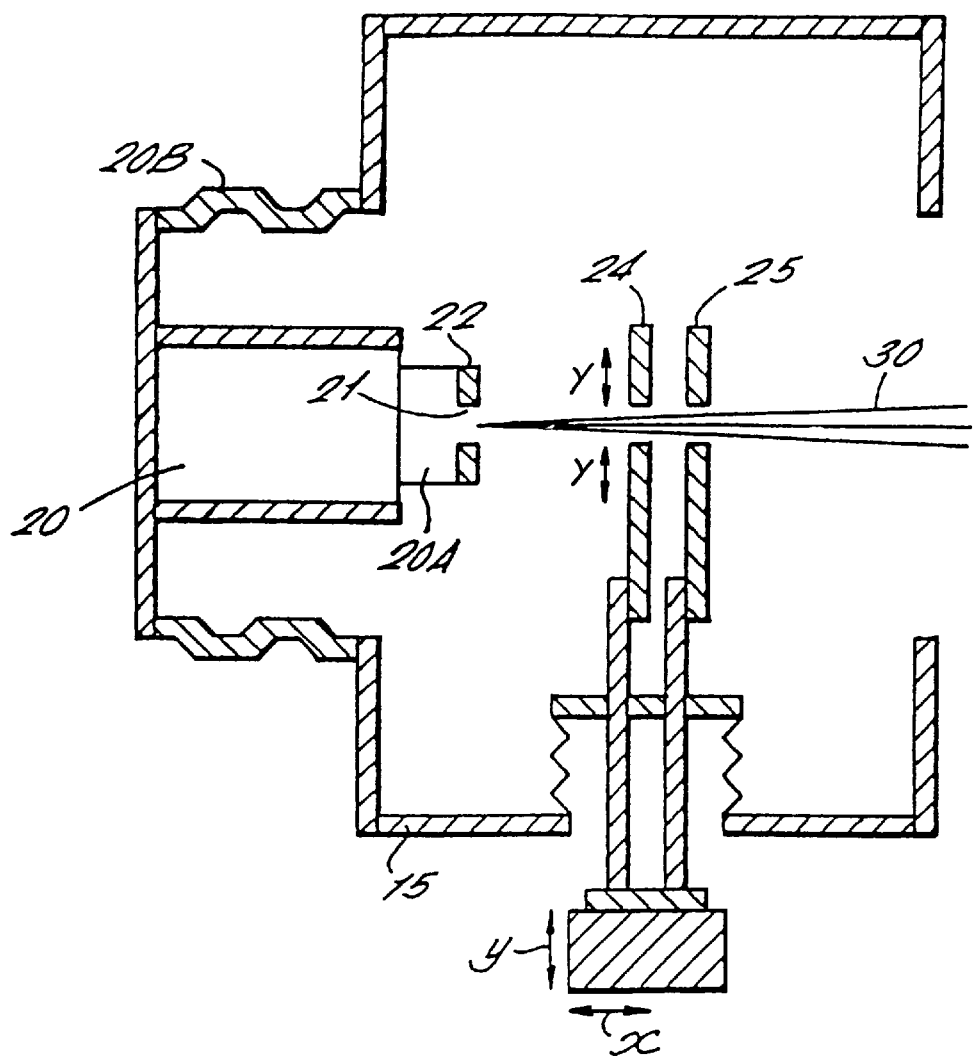
FIG. 2 is a schematic plan view of an ion extraction assembly of the present invention.

Referring to FIG. 2, the ion source and extraction electrodes are illustrated schematically. The ion source 20 comprises an arc chamber 20A mounted to housing 15. A bushing 20B acts as an insulator to isolate the ion source 20 from the remainder of the housing 15. Ions formed in the arc chamber 20A are extracted from the source 20 through an exit aperture 21 in a front face 22 of the source. The front face 22 of the ion source 20 forms a first apertured source electrode at the potential of the ion source (FIG. 1). The extraction electrodes 11 are illustrated in FIG. 2 by suppression and ground apertured electrodes 24, 25 respectively. Each of the apertured electrodes 24, 25 comprise a single electrically conductive plate having an aperture through the plate to allow the ion beam emerging from the ion source 20 to pass through. Each aperture has an elongate slot configuration with the direction of elongation being perpendicular to the plane in FIG. 2.

For a beam of positive ions, the ion source 20 is maintained by a voltage supply at a positive voltage relative to ground. The ground electrode 25 restricts the penetration of the electric fields between the ground electrode 25 and the ion source 20 into the region to the right (in FIG. 2) of the electrode 25.

The energy of the ion beam emerging from the extraction assembly is determined by the voltage supplied to the ion source. A typical value for this voltage is 20 kV, providing an extracted beam energy of 20 keV. However extracted beam energies of 80 keV and higher, or 0.5 keV or lower may also be contemplated. To obtain higher or lower voltages, it is a matter of raising or lowering respectively the source voltage.

The suppression electrode 24 is biased by a voltage supply to a negative potential relative to ground. The negatively biased suppression electrode 24, operates to prevent electrons in the ion beam downstream of the ground electrode 25 (to the right in FIG. 2) from being drawn into the extraction region and into the ion source. As is known to workers in this field, it is important to minimise the loss of electrons from the ion beam in zero electric field regions, so as to maintain ion beam neutralisation.

The suppression and ground electrodes 24, 25 are mounted so as to be movable relatively to the source 20 in the direction of travel of the ion beam 30 as indicated by the arrow x. The apparatus can be "tuned" such that the gap between the extraction and suppression electrodes is larger, the larger the beam energy. The electrodes are further mounted, such that the suppression at 24 and ground 25 electrode are relatively movable laterally in the direction of arrow y, namely in the plane of the paper and perpendicular to the ion beam direction 26, relatively to the source 20. A mechanism is also provided by virtue of which the size of the electrode slit can be adjusted in the lateral direction y as indicated by the arrows Y in FIG. 2.

The invention is equally applicable to a tetrode assembly which is the same as the triode assembly described with reference to FIG. 2, but including an additional extraction electrode, or to extraction structures with any number of electrodes where at least one electrode is required to be movable.

The mechanism by which the electrodes are movable in the directions of arrows x and y and by which the size of the slit is adjusted in y direction will now be described with reference to FIGS. 3 to 6.

The mechanism is designed to move the suppression and ground electrodes 24, 25 both of which are mounted in electrode housing 50 so as to be movable together with one another. The electrode housing 50 has two parts 51, 52 each of which houses half of each of the two electrodes 24, 25. The two parts 51, 52 are movable towards and away from each other in the direction y in order to vary the size of the electrode slit. The electrode housing 50 is also movable as a whole in the direction of arrow y, i.e. across the beam direction, and also in the direction of arrow x along the beam direction.

Each part 51, 52 is mounted on a respective electrode support shaft 53, 54 projecting from manipulator assembly 55. The manipulator assembly 55 is mounted externally of the housing 15 so that the electrode support shafts 53, 54 project into the vacuum chamber defined by the housing.

The mechanism for varying the width of the electrode slit will now be described. The manipulator assembly 55 has a base plate 56 on which this mechanism is mounted. The motive power to adjust the electrode slit width is provided by electrode slit width motor 57. This motor 57 is mounted via a bracket 58 so as to be fixed with respect to a sliding plate 59. The sliding plate 59 is mounted on and slidable with respect to top plate 60 in the direction of arrow y. The top plate 60 has a pair of through holes 61, 62 through which the electrode support shafts 53, 54 project. The motor 57 drives lead screw 63 which has a left hand screw thread portion 64 and a right hand screw thread portion 65 joined by a coupling 66. The electrode support shaft 53 is mounted to left hand screw thread portion 64 via a threaded coupling 66 so as to be movable in the direction of arrow y upon rotation of the lead screw. The electrode support shaft 54 is mounted to right hand screw thread portion 65 via a threaded coupling 67 so as to be movable in the direction of arrow y in the opposite direction to the bracket 66 upon rotation of the lead screw 63. It should be noted, that in FIGS. 4 and 6, a lead screw housing 68 is shown surrounding the lead screw 63. This housing is not shown in any of the other figures.

Each of electrode support shafts 53, 54 is slidably supported with respect to the base plate 56 on an air bearing assembly as will be described. The bearings for the two electrode support shafts are identical, and therefore only the bearing for electrode support shaft 53 will be described in detail.

The air bearing, best illustrated in FIG. 6, comprises an air bearing support plate 69 which is fixed with respect to the base plate 56 via kinematic supports and air piston compensation as described below to prevent distortion of the air bearing surfaces.

A porous graphite plate 70 is mounted on the air bearing support plate 69. A generally annular recess 71 extends around the upper surface of the air bearing support plate surrounding the shaft 53 and facing the porous graphite plate. The recess 71, sealed by O-rings 72, is arranged to be supplied from a source of pressurised air (not shown).

Figure 6:
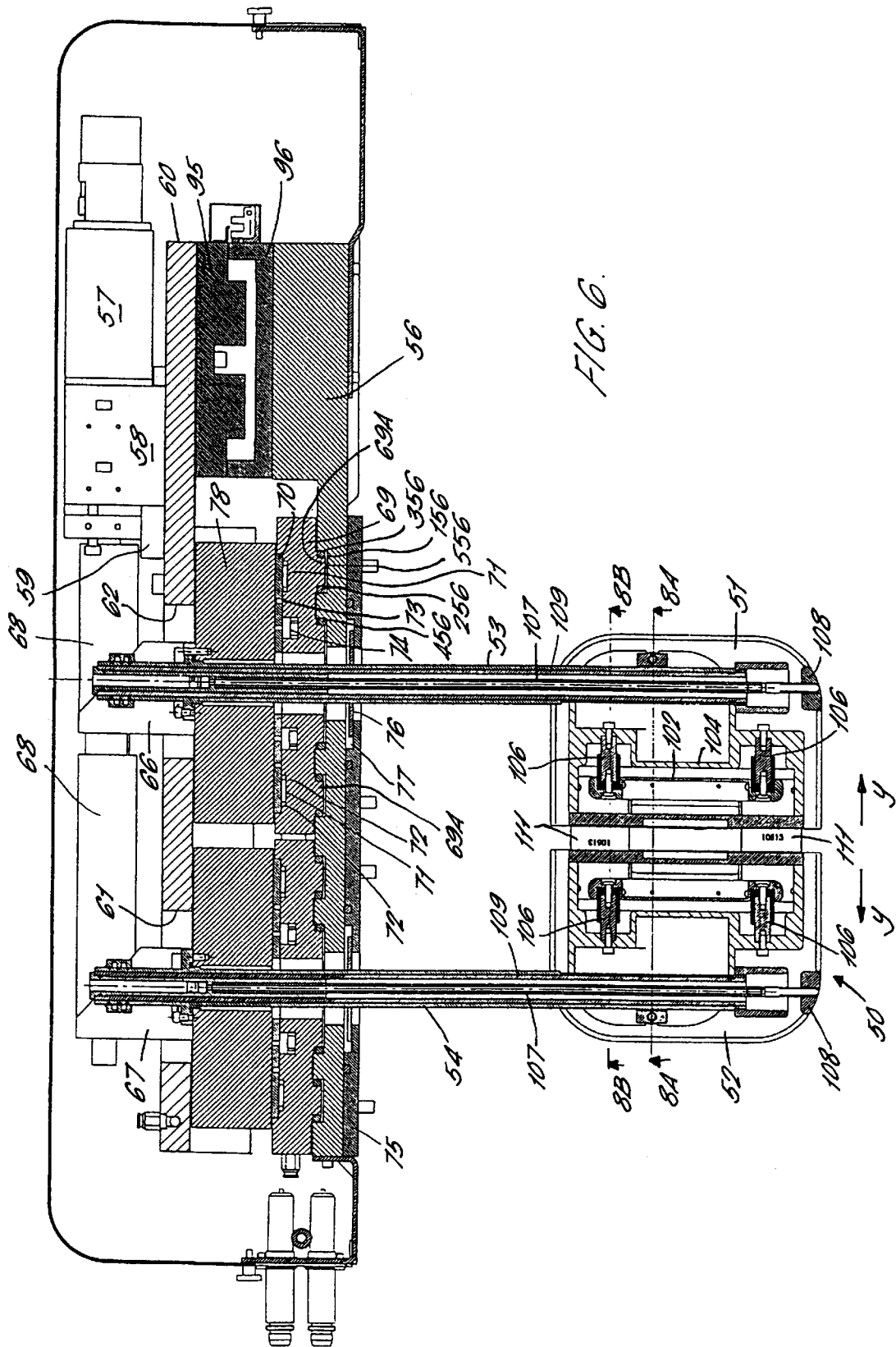
FIG. 6 is a section through line VI—VI of FIG. 5.

A differential pumped seal 73 is shown schematically in FIG. 6. The concept of a differential pumped seal is known in the art, for example from WO 99/13488 (which is incorporated by reference) and will not be illustrated in detail here. This seal provides a way of preserving the vacuum inside the housing 15 and also providing a sufficient flow of air to the plate 70. This is done by providing an annular atmospheric vent 73 radially inwardly of the annular recess 71. Radially inwardly of the atmospheric vent 73 is an annular chamber 74 which is pumped down to vacuum pressure. Thus, most of the air leaking radially inwardly through the porous plate 70 and around the O-ring seals 72 will be vented to atmosphere through atmospheric vent 73. Any remaining air is pumped out through annular chamber 74 so as to preserve the vacuum within the chamber inside housing 15. The presence of the atmospheric vent considerably reduces the pressure to be pumped in the annular chamber 74.

Figure 7:
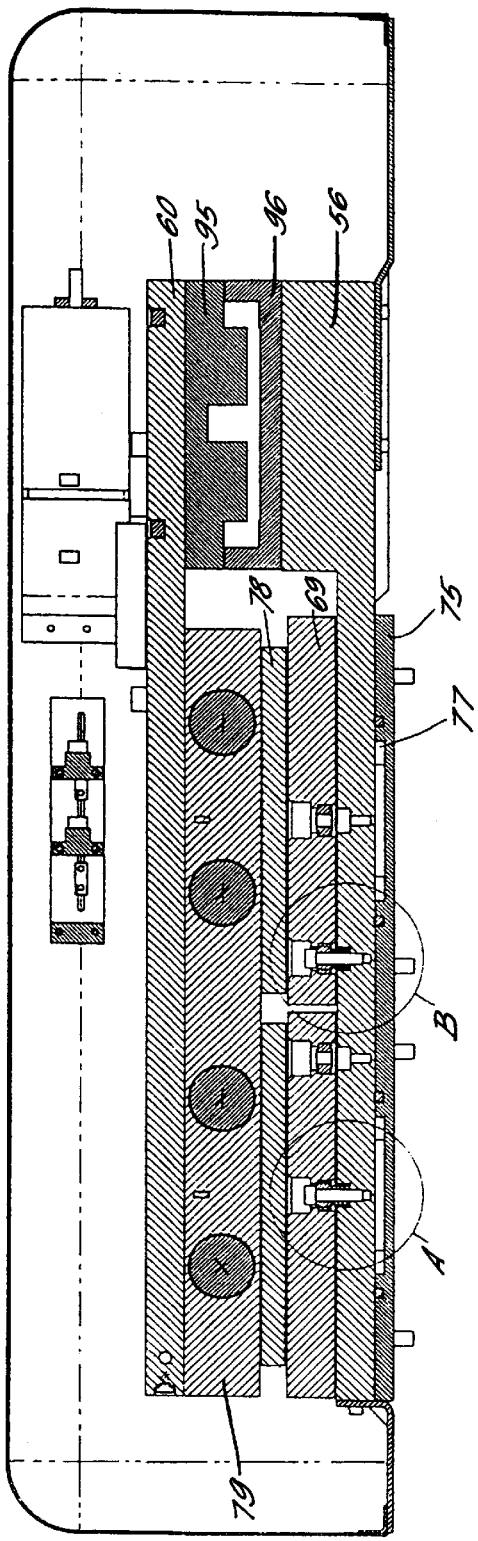
FIG. 7 is a section through line VII—VII of FIG. 5.
Figure 7A:
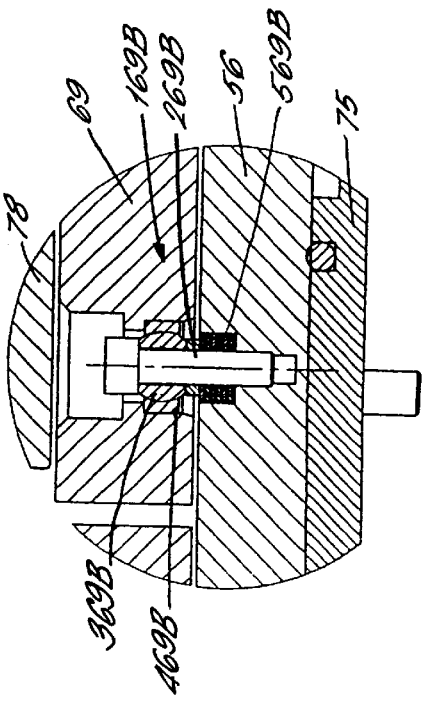
FIG. 7A shows a detail of the part ringed as "A" in FIG. 7.
Figure 7B:
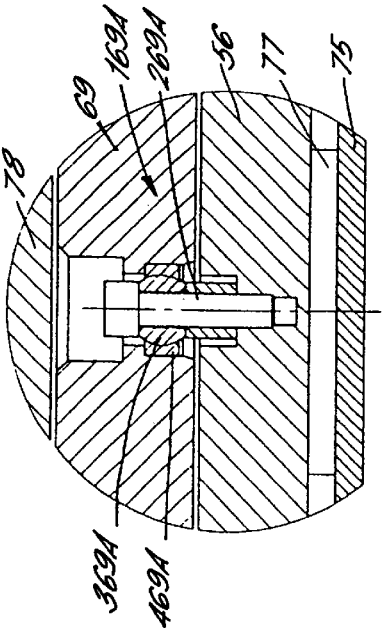
FIG. 7B shows a detail of the part ringed as "B" in FIG. 7.

The fixing of the air bearing support plate 69 to the base place 56 will now be described with particular reference to FIGS. 6, 7, 7A and 7B. Each air bearing support plate 69 is fixed to the base plate 56 by three kinematic mounts. Two of these mounts are shown in FIG. 7. The third mount is positioned out of the plane of FIG. 7 behind one of the mounts that is illustrated, so that the three mounts are arranged generally in an L-shape when viewed from above in FIG. 7. The left hand air bearing support plate 69 as shown in FIG. 7 uses three fixed kinematic mounts 169A one of which is shown in FIG. 7A while the right hand air bearing support plate 69 of FIG. 7 uses three adjustable kinematic mounts 169B one of which is shown in FIG. 7B.

The fixed kinematic mounts 169A essentially comprise a bolt member 269A which is screwed into place to abut against a shoulder in the base plate 56. The bolt member 269A has a part spherical portion 369A which is retained in a complementary recess within the bearing support plate 69. This arrangement prevents any torsional forces being transmitted to the bearing support plate 69.

The adjustable kinematic mounts 169B have a similar structure to the fixed kinematic mounts 169A, and the same reference numerals have been used to designate the same parts, but with suffix B replacing the suffix A. The difference is that, for the adjustable kinematic mount 169B, the bolt 269B is mounted through a stack of spring washers 569B. This allows the height of the air bearing support plate 69 at the location of each adjustable kinematic mount to be adjusted with respect to the base plate 56.

As shown in FIG. 6, an air piston compensation system is provided so as to give further support to the air bearing support plate 69 on the base plate 56. This takes the form of an annular piston 69A which depends downwardly from the air bearing support plate 69. The piston 69A is arranged directly below the load bearing annular recess 71 of the air bearing. The piston 69A is received in a complementary groove 156 in the base plate 56. A pair of O-rings 256, 356, in the groove 156 provide a substantially air-tight seal between the piston 69A and groove 156. A further O-ring seal 456 is provided radially inwardly of the groove 156 to isolate the air piston compensation system from the vacuum chamber. The chamber 556 between the piston 69A and groove 156 is filled with a fluid such as compressed air at a pressure which is just sufficient to support the air bearing support plate 69 against bowing at locations between the kinematic mounts 169A, 169B.

As part of the set up process of the apparatus, the left hand air bearing support plate 69 as shown in FIGS. 6 and 7 is fixed in place by the three fixed kinematic mounts 169A which are screwed down onto respective shoulders in the support plate. The right hand air bearing support plate 69 is then fixed in place, and its position is adjusted using the three adjustable kinematic mounts 169B so as to position the two parts of the electrode 51, 52 precisely with respect to one another. In order to adjust the height of the electrode part 51, all three adjustable kinematic mounts 169B can be adjusted by the same amount. In order to vary the tilt of the electrode part 51, it is simply a matter of adjusting the height of each adjustable kinematic mount 169B with respect to the others until the desired degree of tilt in three dimensions is obtained. Air is then forced into the chambers 556 of the air bearing compensation systems.

A kinematic support and air bearing compensation of this type are described in more detail in U.S. application Ser. No. 09/293,954 the contents of which are incorporated herein by reference.

An aluminium support plate 75 is provided on the lower surface of base plate 56. This plate is arranged to support an annular graphite shield plate 76 around each of the electrode support shafts 53, 54. The shield plate 76 is supported in an oversize circular recess 77 in the upper surface of the support plate 75. The clearance between the shield plate 76 and a corresponding circular recess 77 is such that the electrodes support shafts 53, 54 are free to move throughout their entire range of movement. Throughout this movement, the shield plate 76 obstructs the entire opening through which the electrodes support shaft 53, 54 extend, thus preventing sputtered and condensed material getting to the air bearing surface. This combination of the differentially pumped seal 73 and shield plate 76 replaces a conventional bellows arrangement, which is notorious for generating particulate contaminants.

The electrode support shaft 53 is fixed to air bearing slide 78 which is slidably supported to fly on a thin cushion of air on the upper surface of porous graphite plate 70. The use of a porous graphite bearing requires only a very small air gap between the porous graphite plate 70 and the air bearing slide 78 thereby optimising the stiffness of the bearing and minimising the risk of collapse. The control of the position of the electrodes can be done electronically using high speed servo motors. This provides very precise high speed, low friction control of movement of the electrodes enabling a quick tuning of the apparatus. The apparatus can move the electrodes throughout the full range of movements and settle them in a chosen position within 800 ms.

Figure 3:
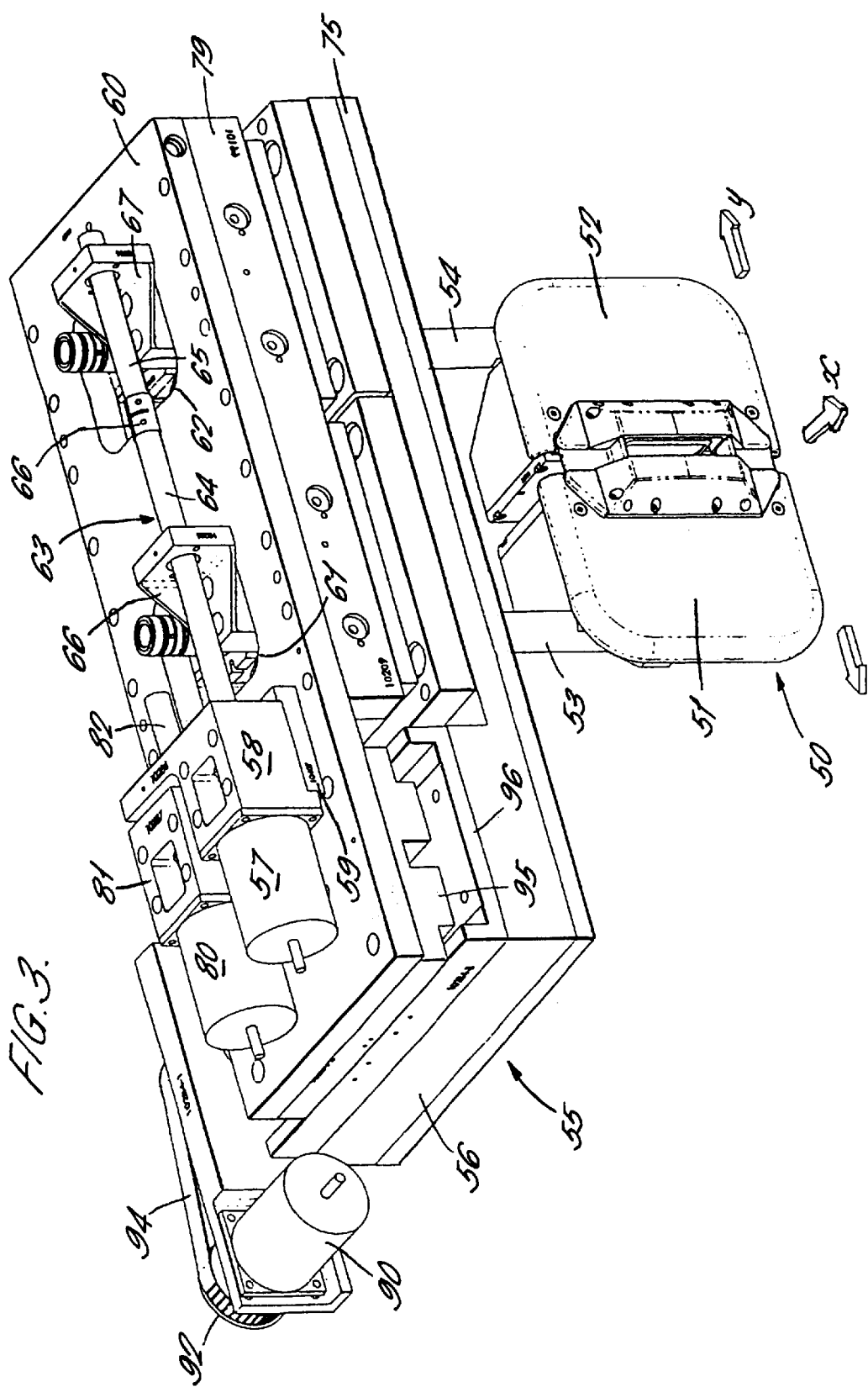
FIG. 3 is a perspective view of an electrode manipulator for use in an ion extraction assembly according to the present invention.
Figure 4:
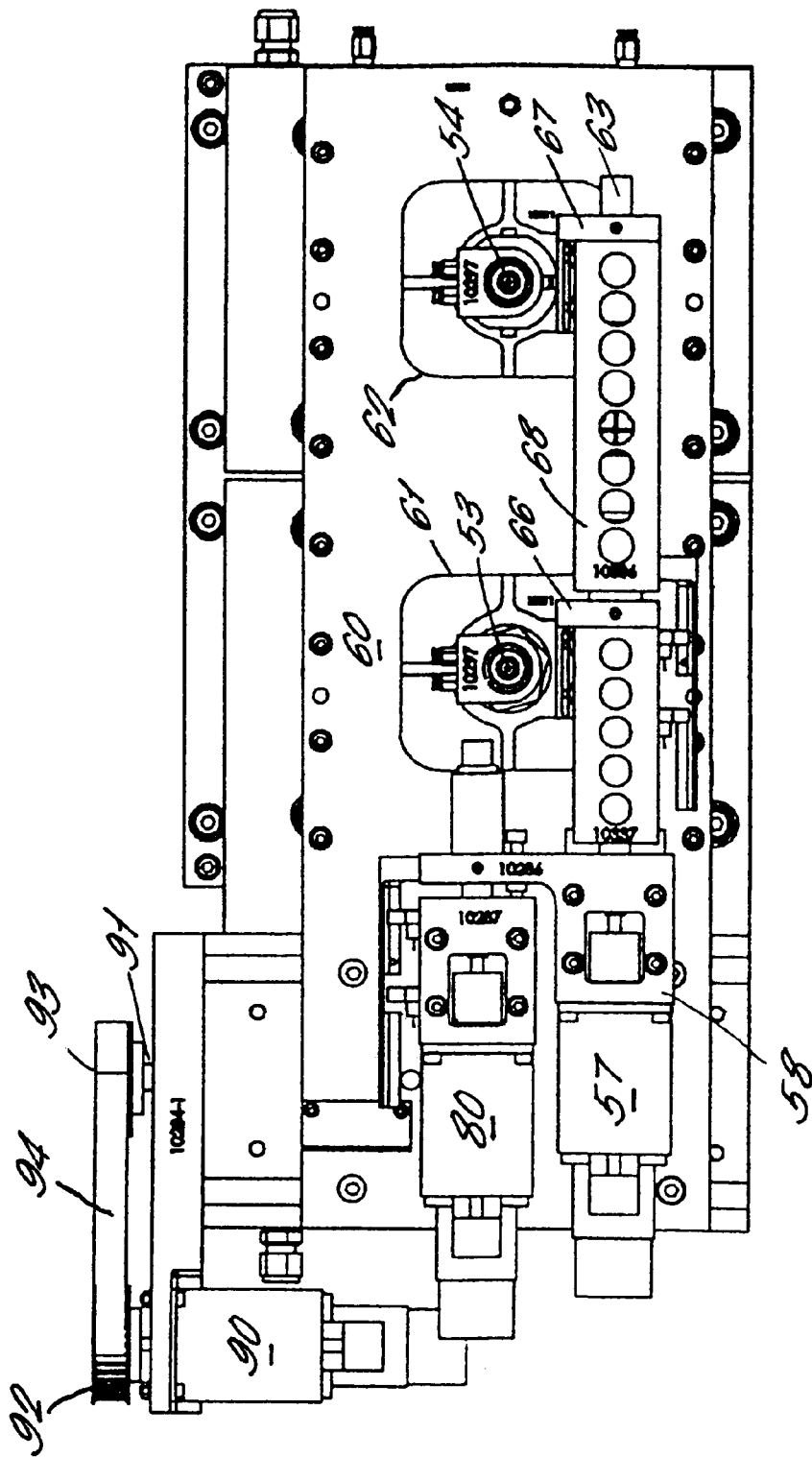
FIG. 4 is a plan view of the electrode manipulator of FIG. 3.
Figure 5:
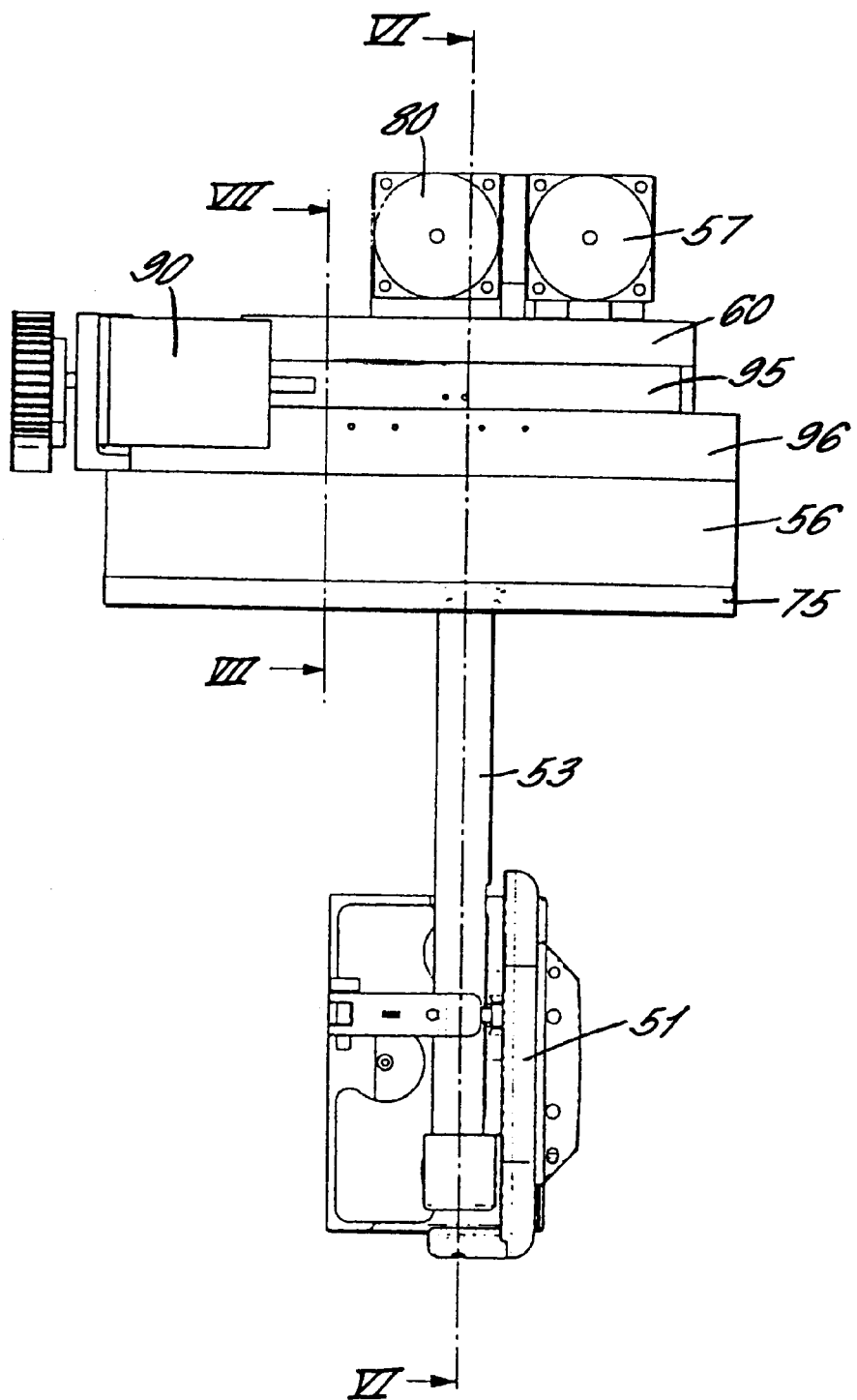
FIG. 5 is an end view from the left end of the electrode manipulator of FIGS. 3 and 4.

An air bearing side guide 79 depends from either side of the top plate 60 (only one of these is shown in FIG. 3). The air bearing side guides support the air bearing slides 78 so as to constrain the slides for movement only in the direction of arrow y.

The mechanism for moving the entire electrode housing 50 in the direction of arrow y will now be described. This lateral motion is driven by lateral position motor 80 which is mounted with respect to the top plate 60 by a bracket 81. The motor 80 drive a lead screw 82 which projects through and is threadably coupled with the bracket 58 supporting the electrode slit width motor 57. Therefore, upon rotation of the lead screw 82, the bracket 58 which is supported on sliding plate 59 is caused to move in the direction of arrow y taking with it the electrode slit width motor 57, lead screw 63, couplings 66, 67, electrode support shafts 53, 54, air bearing slides 78 and electrode housing 50. The sliding plate 59 is constrained by cross roller bearings (not shown) so as to move only in the direction of arrow y.

The mechanism for moving the electrode assembly in the x direction will now be described. This motion is driven by extraction gap motor 90 which is fixed with respect to the base plate 56. This motor is arranged to drive a third lead screw 91 via a pair of pulleys 92, 93 and a timing belt 94. The lead screw 91 drives a slide 95 which is fixed to the lower surface of the top plate 60 and is constrained to move by cross roller bearings in a linear direction x. The plate 95 is supported within a channel 96 mounted on the base plate 56.

The extraction gap motor 90 drives the lead screw 91 which causes the slide 95 to move in the direction of arrow x. This moves the entire top plate 60 together with everything mounted with respect to the top plate including the electrode slit width motor 57, lateral position motor 80, lead screws 63 and 82, couplings 66, 67, electrode support shafts 53, 54 and electrode housing 50.

The structure of the electrode parts 51, 52 will now be described with particular reference to FIGS. 6, 8A and 8B. These two electro parts 51, 52 house a pair of two-part electrode, namely a suppression electrode 100 which consists of a front plate 101, and a rearwardly extending portion 102, and a ground electrode 103 which consists of a rear plate 104 and a forwardly extending portion 105. The two electrodes are mounted to one another by four insulators 106. The electrical connection to the suppression electrode is provided by a pair of electrically conductive rods 107 extending downwardly within the support shafts 53, 54 and connected at the lower most end to a pair of sockets 108 in the front plate 101 of the support electrode 100.

An electrical connection to the ground electrode 103 is made by a pair of tubular sleeves 109 which extend downwardly within the support shafts 53, 54 surrounding the electrically conductive rods 107. These tubular sleeves 109 are connected at their lower ends to the rear plate 104 of the ground electrode 103 as shown in FIG. 6.

A pair of insulating hinged clamps 110 is connected between the front plate 101 of the suppression electrode 100 and the rear plate 104 of the ground electrode 103. These clamp onto the electrode support shafts 53, 54 to hold the electrode assembly in place. At the top and bottom of the electrode slit, a plate 111 extends across the slit, so that it is closed top and bottom. Although not apparent from the drawings, one of the plates 111 is preferably provided on one half of the electrode assembly, while the other plate is preferably provided on the other half, thereby allowing two identical parts to be used for the two sides of the electrode assembly, with one part being in an inverted configuration with respect to the other. Sufficient clearance is provided in the part of the electrode opposite to the plate, such that when the width of the electrode slit is adjusted, there is sufficient space for the plates to move.

It will therefore be appreciated that the mechanism as described offers independent control of the movement of the electrode housing 50 in the x direction to increase the gap between suppression electrode 24 and extraction electrode 23, lateral movement of the electrodes 24, 25 to shift the electrode slit in direction perpendicular to the direction of the ion beam 30, and control of the width of the slits of the suppression and ground electrodes.

What is claimed is:

1. An ion extractor assembly comprising:
    an ion source,
    at least one electrode for extracting ions from the source, the electrode having a slit through which a beam of extracted ions passes, said slit having a centerline midway across the width of said slit, and
    an electrode manipulator on which the electrode is mounted, said manipulator having a first actuator which varies the width of said slit while maintaining the position of the said centerline relative to said manipulator, and two or more additional actuators for moving said centerline transversely and in the direction of said ion beam.

2. An assembly according to claim 1, wherein a second actuator moves said centerline transversely to the ion beam, and a third actuator moves said centerline in the direction of said ion beam, the first, second and third actuators being arranged to operate independently of one another.

3. An assembly according to claim 1, wherein the electrode comprises two parts which between them form the slit, wherein part of the electrode is movable relatively to the other part of the electrode in the direction of the ion beam.

4. An assembly according to claim 2, wherein the first actuator is mounted on and moveable with one of the second and third actuators, the one of the second and third actuators being mounted on and movable with the other of the second and third actuators.

5. An assembly according to claim 1, wherein the electrode is movably mounted on at least one air bearing.

6. An assembly according to claim 5, wherein the air bearing is a porous plate type air bearing provided with differentially pumped seal.

7. An assembly according to claim 5, wherein the electrode is supported on at least one shaft, each shaft being surrounded by a shield plate movable with the shaft to shield the air bearing from contaminants in all positions of the electrode.

8. An assembly according to claim 1, wherein the first actuator comprises a first motor for driving a first lead screw having a first portion with a screw thread, and a second portion with a screw thread of oppositely handed configuration to the first screw thread, the electrode being provided in two halves, one of which is threadably coupled to the first screw threaded portion, and the other of which is threadably coupled to the second screw threaded portion, so as to be movable in opposite directions upon rotation of the first lead screw.

9. An assembly according to claim 1, wherein the first actuator is slidably mounted on a plate, and the second actuator is preferably fixed to the plate and comprises a second motor and a second lead screw threadably coupled to the first actuator in order to move the entire first actuator and electrode transversely to the ion beam upon rotation of the second lead screw.

10. An assembly according to claim 9, wherein a pair of air bearing side guides are provided to depend from the plate in order to restrain the electrode to move only in the direction transverse to the ion beam.

11. An assembly according to claim 1, wherein the third actuator is fixed to a housing and comprises a third motor driving a third lead screw, threadably coupled to a top plate, the top plate being slidably retained on the housing so as to be movable in the direction of the ion beam, upon rotation of the third lead screw.

12. An assembly according to claim 1, wherein the at least one electrode is provided by a suppression electrode and a ground electrode which are movable together by the electrode manipulator with respect to a source electrode and an extraction electrode.

13. A method of adjusting an electrode in an ion extraction assembly comprising at least one electrode for extracting ions from an ion source, the electrode having a slit through which a beam of extracted ions passes, said slit having a centerline midway across the width of the slit, and an electrode manipulator on which the electrode is mounted, the method comprising the steps of,
    driving a first actuator to vary the width of said slit while maintaining the position of said centerline with respect to said manipulator,
    driving a second actuator to adjust the position of said centerline transversely to the ion beam, and
    driving a third actuator to adjust the position of said centerline in the direction of the ion beam, the movements of said first through third actuators being carried out independently.

14. A method according to claim 13, further comprising providing at least one porous plate air bearing with a differentially pumped seal to support the electrode, supplying air to the air bearing, and pumping the differentially pumped seal.

15. An ion implanter comprising a substrate holder for holding a substrate to be implanted; and
    an ion extraction assembly comprising an ion source, at least one electrode for extracting ions from an ion source, the electrode having a slit through which a beam of extracted ions passes, said slit having a centerline midway across the width of the slit, and
    an electrode manipulator on which the electrode is mounted, said manipulator having a first actuator which varies the width of said slit without changing the position of the said centerline relative to said manipulator, and an additional actuator for moving said centerline transversely and in the direction of said ion beam.

16. An ion extraction assembly for an ion source comprising:
    at least one electrode for extracting ions from the source to form a beam having a beam direction parallel to a first axis of a rectangular co-ordinate system, the electrode comprising at least first and second electrode parts forming a slit through which the beam of extracted ions passes in use, said slit being aligned along a second axis of said coordinate system; and
    an electrode manipulator on which the electrode is mounted, the manipulator including,
        first and second actuators for selectively varying the width of the electrode slit transverse to the ion beam in the direction of a third axis of said coordinate system, and moving the electrode transversely to the ion beam in said third axis direction,
        a third actuator moving the electrode in the direction of the ion beam along said first axis of said coordinate system, and first and second air bearings supporting said first and second electrode parts for independent movement thereof in a plane substantially parallel to said first and third axes of said coordinate system, each said air bearing having,
- a respective support plate defining the respective plane of movement of the respective said electrode part on said air bearing, and
- a respective mounting arrangement for each support plate, at least one said mounting arrangement being adjustable to enable adjustment of the position of one said support plate relative to the other.

17. An ion extraction assembly for an ion source comprising:
- at least one electrode for extracting ions from the source to form a beam having a beam direction parallel to a first axis of a rectangular co-ordinate system, the electrode comprising at least first and second electrode parts forming a slit through which the beam of extracted ions passes in use, said slit being aligned along a second axis of said coordinate system; and
- an electrode manipulator on which the electrode is mounted, the manipulator including,
  - actuators for selectively moving the electrode transversely to the ion beam in said third axis direction and in the direction of the ion beam along said first axis of said coordinate system, and
  - at least one air bearing supporting said first and second electrode parts for independent movement thereof in a plane substantially parallel to said first and third axes of said coordinate system, said air bearing having,
    - at least one shaft extending parallel to said second axis and supporting the electrode from the air bearing,
    - a base plate having an aperture receiving said shaft, said aperture being oversized relative to said shaft to accommodate said movement of the electrode, and
    - a shield plate movable with said shaft and extending normal to said second axis, said shield plate being oversized relative to said aperture,
    - said base plate including a surface surrounding said aperture which is arranged to cooperate with said oversized shield plate, so that the shield plate shields the air bearing from beam generated contaminants in all positions of the electrode.

18. An ion extraction assembly as claimed in claim 17, wherein said base plate includes an annular recess supporting said shield plate and being oversized to accommodate the shield plate in all positions of the electrode.

* * * * *